United States Patent
Lee et al.

(10) Patent No.: US 7,674,643 B2
(45) Date of Patent: Mar. 9, 2010

(54) GALLIUM NITRIDE SEMICONDUCTOR LIGHT EMITTING DEVICE AND METHOD OF MANUFACTURING THE SAME

(75) Inventors: Jae Hoon Lee, Seoul (KR); Jung Hee Lee, Daegu (KR); Je Won Kim, Seoul (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 605 days.

(21) Appl. No.: 11/443,376

(22) Filed: May 31, 2006

(65) Prior Publication Data

US 2006/0215256 A1 Sep. 28, 2006

Related U.S. Application Data

(62) Division of application No. 10/843,594, filed on May 12, 2004, now abandoned.

(30) Foreign Application Priority Data

Dec. 24, 2003 (KR) ............................... 2003-95988

(51) Int. Cl.
*H01L 21/00* (2006.01)
(52) U.S. Cl. ..................... 438/46; 438/47; 438/602; 438/604
(58) Field of Classification Search .................. 438/31, 438/45–47, 602–604, 46; 257/79
See application file for complete search history.

(56) References Cited

U.S. PATENT DOCUMENTS

| 6,218,207 | B1 | 4/2001 | Itoh et al. |
| 6,288,417 | B1 | 9/2001 | Nickel et al. |
| 6,316,785 | B1 | 11/2001 | Nunoue et al. |
| 6,380,051 | B1 | 4/2002 | Yuasa et al. |
| 6,534,332 | B2 | 3/2003 | Bourret-Courchesne |
| 6,593,016 | B1 * | 7/2003 | Chiyo et al. ................. 428/698 |
| 6,631,149 | B1 * | 10/2003 | Tezen et al. ............ 372/45.012 |
| 2001/0002048 | A1 | 5/2001 | Koike et al. |
| 2002/0158258 | A1 * | 10/2002 | Chyi ........................... 257/79 |
| 2003/0057438 | A1 | 3/2003 | Yu et al. |
| 2003/0143772 | A1 | 7/2003 | Chen |
| 2005/0118825 | A1 | 6/2005 | Nishijima et al. |

FOREIGN PATENT DOCUMENTS

| JP | 10-92749 A | 4/1998 |
| JP | 10-107317 A | 4/1998 |
| JP | 10-107319 A | 4/1998 |
| JP | 11-135889 A | 5/1999 |
| JP | 2000-49092 A | 2/2000 |

(Continued)

OTHER PUBLICATIONS

Japanese Patent Office, Office Action mailed Jan. 16, 2007.

*Primary Examiner*—Thien F Tran
(74) *Attorney, Agent, or Firm*—Lowe Hauptman Ham & Berner

(57) ABSTRACT

A gallium nitride semiconductor LED includes a substrate for growing a GaN semiconductor material, an n-type GaN clad layer formed on the substrate and doped with Al, an active layer having a quantum well structure formed on the n-type GaN clad layer, and a p-type GaN clad layer formed on the active layer.

10 Claims, 6 Drawing Sheets

FOREIGN PATENT DOCUMENTS

| | | |
|---|---|---|
| JP | 2000-133841 A | 5/2000 |
| JP | 2001-160627 A | 6/2001 |
| JP | 2001-196702 A | 7/2001 |
| JP | 2001-284266 A | 10/2001 |
| JP | 2003-303995 | 10/2003 |
| KR | 2000-0069995 | 11/2000 |

* cited by examiner (a)

(b)

GALLIUM NITRIDE SEMICONDUCTOR LIGHT EMITTING DEVICE AND METHOD OF MANUFACTURING THE SAME

RELATED APPLICATIONS

The present application is a divisional of application Ser. No. 10/843,594, filed May 12, 2004, now abandoned and is based on, and claims priority from, Korean Application Number 2003-95988, filed Dec. 24, 2003, the disclosures of which are hereby incorporated by reference herein in their entirety.

BACKGROUND OF THE INVENTION

1. Field of the Invention

The present invention relates to a gallium nitride (GaN) semiconductor light emitting device (LED), and more particularly to a high quality GaN semiconductor light emitting device and a method of manufacturing the same, which comprises a buffer layer consisting of single crystal AlN and which causes a reduction of defects, such as Ga vacancies and dislocations caused by lattice mismatching, by Al doping when growing GaN, thereby enhancing electrical and optical properties.

2. Description of the Related Art

Recently, a light emitting device display board developed as a new transmission media for images or information has been advanced to a level of displaying a moving image, such as various CF images, graphic images, video display, etc., starting from information of simple characters or figures in the early days of the LED display board. With regard to colors, as a high brightness blue LED using a nitride semiconductor has emerged recently, it has become possible to exhibit a full color display using colors of red, yellow-green and blue, not limited to an existing monochromatic coarse display or at most a limited range of colors, such as red or yellow-green, in the past. Nevertheless, the yellow-green LED has a lower brightness than the blue LED or the red LED and emits light having a wavelength of about 565 nm which is not the wavelength of green required for the three primary colors. Thus, it is not possible to display the full range of natural colors. These problems are overcome by a high brightness pure green nitride semiconductor LED emitting a wavelength of 565 nm suitable for displaying the full range of natural colors.

Such nitride semiconductors use a nitride semiconductor material with the formula $Al_xIn_yGa_{(1-x-y)}N$ (where $0 \leq x \leq 1$, $0 \leq y \leq 1$, $0 \leq x+y \leq 1$), and investigations are being actively undertaken particularly on the semiconductor LED using GaN. Meanwhile, although a sapphire substrate is generally used as a dielectric substrate in the nitride semiconductor LED, there is no commercially available substrate which has an identical crystal structure to that of a nitride semiconductor material, such as GaN, and which is in lattice matching with the material. Thus, crystal defects are created due to the differences in lattice parameters and in thermal expansion coefficient between the sapphire substrate and a GaN layer grown on the sapphire substrate. In order to prevent these defects, conventionally, after a GaN buffer layer grown at a low temperature is formed on the sapphire substrate, a GaN layer is grown on the buffer layer at a high temperature. This process is provided to decrease the difference in lattice parameters between the sapphire substrate and the GaN layer.

Nevertheless, the buffer layer grown at a low temperature has a great number of crystal defects and properties closer to a non-crystalline structure rather than a crystalline structure. Thus, if the GaN layer is directly grown at a high temperature on the buffer layer grown at the low temperature, a large number of crystal defects move toward the upper GaN layer grown at the high temperature, thereby creating the defects, which are referred to as "dislocations."

Conventionally, in order to grow the GaN layer free of dislocations, the LEO (Lateral Epitaxy Overgrowth) method [also referred to as ELOG (Epitaxial Lateral Overgrowth) method] or the pendeoepitaxy method has been suggested. Both methods prevent defects created at the interface between the sapphire substrate and the GaN layer from moving upward by laterally growing the GaN layer. Specifically, in the LEO method, after a dielectric mask is formed on the sapphire substrate, or on the GaN epitaxial layer primarily grown on the sapphire substrate, the GaN layer is overgrown on the portion where the mask is not formed, such that the overgrowing GaN layer can grow laterally. Meanwhile, according to the pendeoepitaxy method, after the primary growth of the GaN epitaxial layer on the sapphire substrate and the formation of the masks on the primarily grown GaN epitaxial layer, as is similar to the LEO method, the mask is partially etched and formed with grooves, so that the GaN epitaxial layer is overgrown on the grooves.

FIGS. 1a to 1d show a method of growing the GaN layer with the conventional LEO method as described above. According to the LEO method, as shown in FIG. 1a, a GaN epitaxial layer 11 is primarily grown on a sapphire substrate 10, and as shown in FIG. 1b, a mask 12 with predetermined patterns is formed on the GaN epitaxial layer 11 using a silicon oxide film or a silicon nitride film. As shown in FIG. 1c, the GaN is overgrown on the portion where the mask 12 is not formed. On the mask 12, a GaN layer 13 is laterally grown, as indicated by an arrow of FIG. 1c. As the lateral growth of GaN is completed, the growth of the GaN layer 13 is completed, as shown in FIG. 1d. In addition to the above steps of the LEO method, the pendeoepitaxy method further comprises the step of etching to remove the portion of the GaN epitaxial layer which is not covered with the mask, after forming the mask.

It is generally known that the dislocations moving in the GaN layer formed by the LEO method or by the pendeoepitaxy method tend to be reduced. As shown in FIG. 2, in the portion to which the primarily grown epitaxial layer 11 is exposed, the underlying dislocations move to the overgrowing GaN layer 13, while in the portion covered with the mask 12, the GaN layer 13 is laterally overgrown and no underlying dislocations move, thereby reducing the defects.

However, in case of growing GaN with these methods, there are problems that the dislocations A in the portion which the mask does not cover continue to move upward, and that a high density of dislocations B is created at the interface where the laterally overgrowing GaN layers 13 meet. Further, the defects are created due to the stress generated between the material of the mask 12 and the overgrown GaN layer 13. Due to the defects caused by such dislocations, the electrical and optical properties of the nitride semiconductor device are deteriorated and the yield is reduced.

In addition to these problems, the step of preparing the mask in the above methods caused increased costs, and the addition of the steps of patterning and overgrowing after the primary growth of the GaN epitaxial layer complicate the process.

As described above, even though the LEO method or the pendeoepitaxy method is applied so as to reduce defects caused by lattice mismatching, there are problems that the defects, such as dislocations, cannot be significantly reduced and the added steps result in a complex process and increased costs. Thus, there is a need in the art to provide a new GaN semiconductor LED and a method of manufacturing the same, which exhibits excellent electrical and optical properties by preventing the defects, such as dislocations caused by the lattice mismatching between the sapphire substrate and the nitride semiconductor material, such as GaN.

SUMMARY OF THE INVENTION

The present invention has been made in view of the above problems, and it is an object of the present invention to provide a gallium nitride semiconductor light emitting device and a method of manufacturing the same, in which defects, such as Ga vacancies and dislocations caused by lattice mismatching, are reduced by doping a small amount of Al when an n-type GaN layer is grown, whereby electrical and optical properties are reduced.

In accordance with an aspect of the present invention, the above and other objects can be accomplished by the provision of a gallium nitride (GaN) semiconductor light emitting device for a flip chip, the GaN semiconductor light emitting device comprising:

a substrate for growing a GaN semiconductor material;

an n-type GaN clad layer formed on the substrate and doped with Al;

an active layer having a quantum well structure formed on the n-type GaN clad layer; and a p-type GaN clad layer formed on the active layer.

In the GaN semiconductor light emitting device according to the present invention, the n-type GaN clad layer may be doped with Al in a content of 0.01%~1%.

The light emitting device may further comprise a buffer layer formed between the substrate and the n-type GaN clad layer. The buffer layer may comprise an Al seed layer formed on the substrate layer and an AlN layer formed on the Al seed layer. The AlN layer may be a single crystal AlN layer and have a thickness of 10 nm~50 nm.

The light emitting device may further comprise a GaN interlayer formed between the buffer layer and the n-type GaN clad layer. The GaN interlayer may have a thickness of 100 nm~1 μm.

The light emitting device may further comprise an Al-doped GaN layer formed between the GaN interlayer and the n-type GaN clad layer. The Al-doped GaN layer may be doped with Al in a content of 0.01%~1% and have a thickness of 1 μm~4 μm.

In accordance with another aspect of the present invention, there is provided a method of manufacturing a GaN semiconductor light emitting device as described above, the method comprising the steps of:

a) preparing a substrate for growing a GaN semiconductor material;

b) forming an n-type GaN clad layer doped with Al on the substrate;

c) forming an active layer of a quantum well structure on the n-type GaN clad layer; and d) forming a p-type GaN clad layer on the active layer.

In the method of manufacturing the GaN semiconductor light emitting device, the step b) may comprise the step of forming an n-type GaN clad layer doped with Al in a content of 0.01%~1%.

The method may further comprise the step of e) forming a buffer layer on the substrate before the step b). The step e) may comprise the step of e-1) forming an Al seed layer on the substrate layer and the step of e-2) forming an AlN layer on the Al seed layer. Specifically, the step e-2) may comprise the step of forming a single crystal AlN layer with a thickness of 10 nm~50 nm at a high temperature of 1,000° C.~1,100° C. using an MOCVD (Metal Organic Chemical Vapor Deposition) process.

The method may further comprise the step of f) forming a GaN interlayer on the buffer layer before the step b), and the step f) may comprise the step of forming a GaN interlayer with a thickness of 100 nm~1 μm.

The method may further comprise the step of g) forming an Al-doped GaN layer on the GaN interlayer before the step b). The step g) may comprise the step of forming an Al-doped GaN layer with a thickness of 1 μm~4 μm and an Al content of 0.01%~1%.

The method may further comprise the steps of:

e) removing a predetermined portion of the active layer and p-type clad layer to expose a predetermined portion of the n-type clad layer;

f) forming a p-metal layer on the p-type clad layer; and g) forming a p-side bonding electrode and an n-side electrode on the p-metal layer and on the exposed portion of the n-type clad GaN layer, respectively.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

A GaN semiconductor light emitting device and a method of manufacturing the same according to a preferred embodiment of the present invention will now be described in detail with reference to the accompanying drawings.

Figure 1:
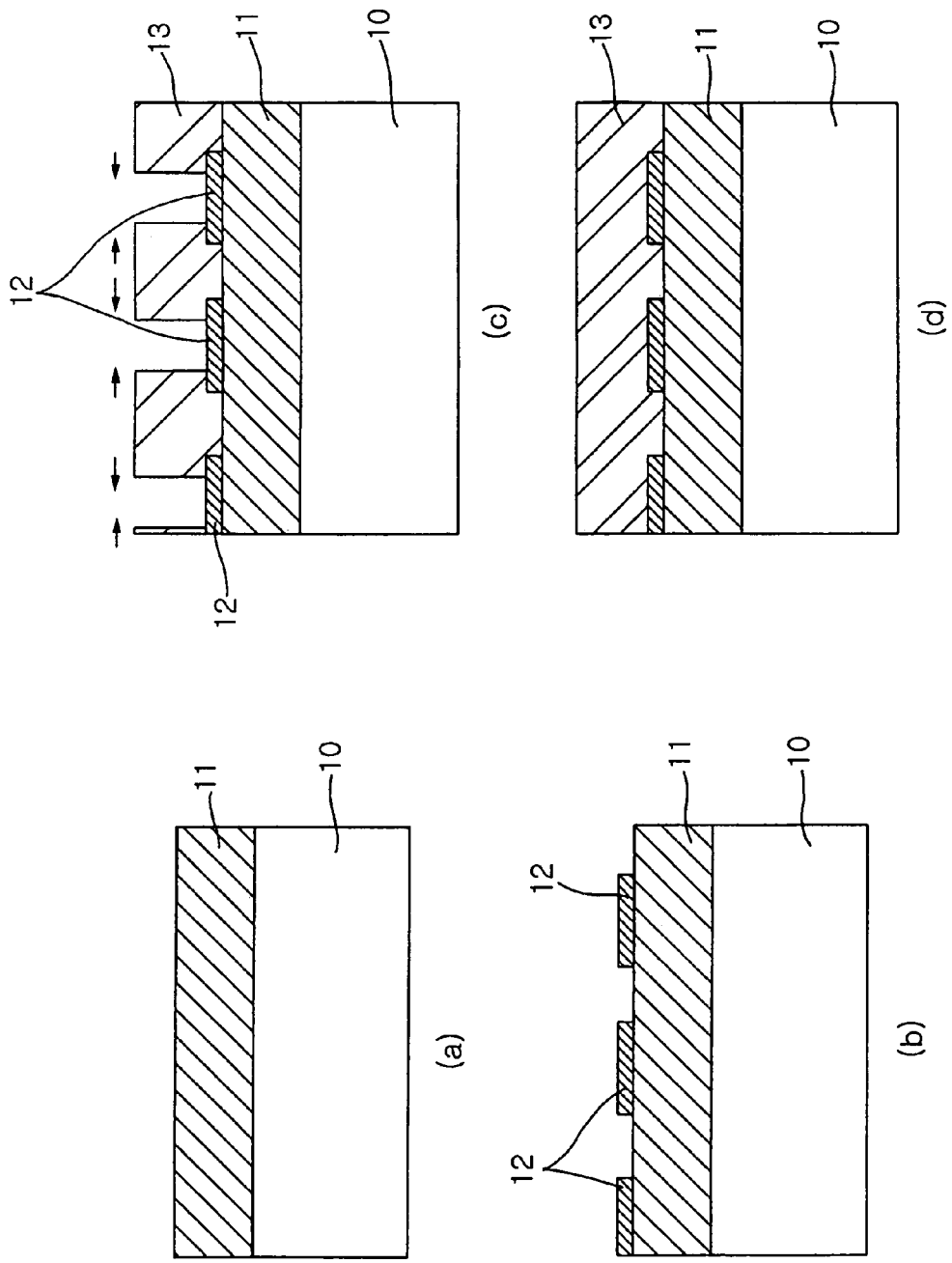
FIGS. 1a to 1d are sectional views of a flow diagram showing a method of growing a GaN layer according to conventional LEO method.
Figure 2:
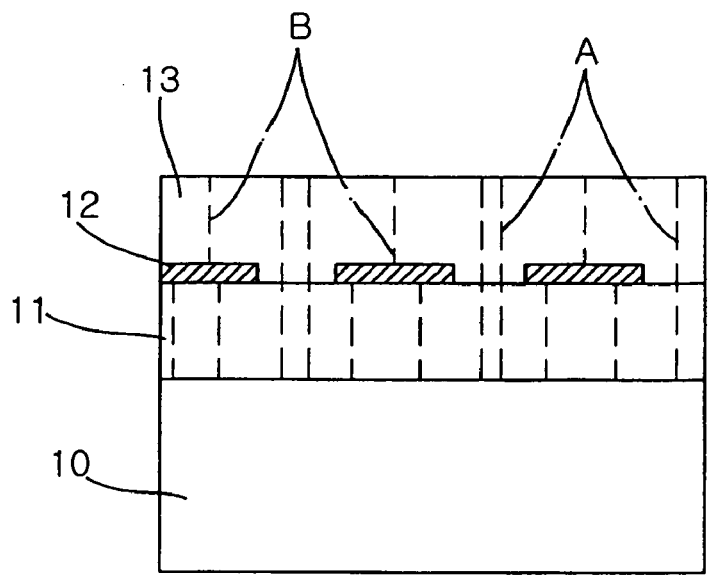
FIG. 2 is a view showing dislocations created in the GaN layer grown by the conventional LEO method.
Figure 3:
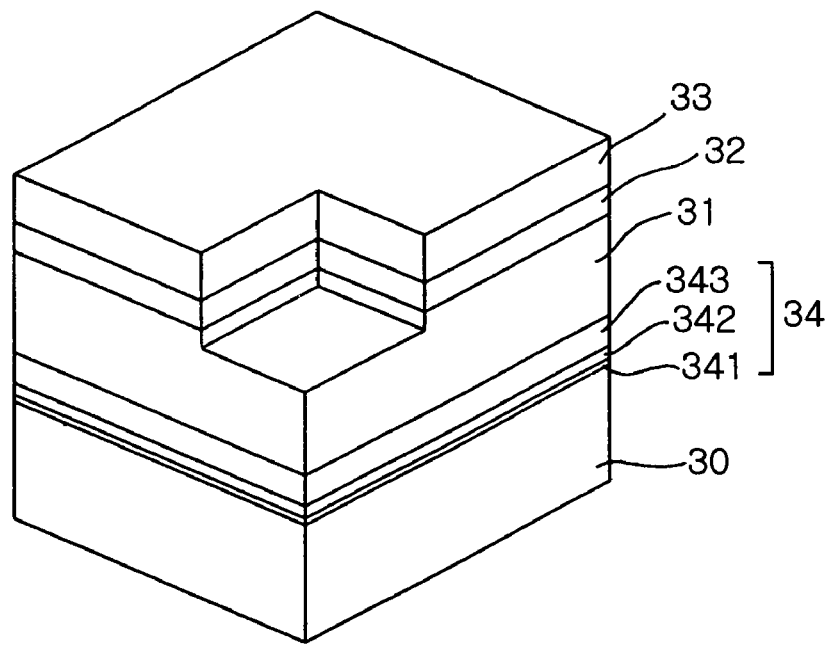
FIG. 3 is a perspective view showing a GaN semiconductor LED according to an embodiment of the present invention.

FIG. 3 is a perspective view of the GaN semiconductor LED according to the embodiment of the present invention. Referring to FIG. 3, the GaN semiconductor LED of the present invention comprises a substrate 30 for growing a GaN semiconductor material, a buffer layer 341 formed on the substrate 30, a GaN interlayer 342 formed on the buffer layer 341, an Al-doped GaN layer 343 formed on the GaN interlayer 342, an Al-doped n-type GaN clad layer 31 formed on the Al-doped GaN layer 343, an active layer 32 having a quantum well structure formed on the n-type GaN clad layer 31, and a p-type GaN clad layer 33 formed on the active layer.

As for the substrate 30, either a sapphire substrate or a SiC substrate can be used, the former is preferred in the art. This is because there is no commercially available substrate which has an identical crystal structure to that of the nitride semiconductor material grown on the substrate 30 and which is in lattice matching with the material.

The n-type GaN clad layer 31 consists of an n-type doped GaN semiconductor material using Si as impurities. According to the present invention, the n-type doped GaN semiconductor material is doped with Si together with Al. The n-type GaN clad layer 31 is formed by growing the GaN semiconductor material on the substrate, with a well-known deposition process, such as the MOCVD process. Since it is difficult to have good quality crystal growth due to the differences in thermal expansion coefficients and in stresses caused by lattice mismatching, a buffer layer 341 may be prepared on the substrate in advance when growing the GaN semiconductor material on the sapphire substrate 30.

As for the buffer layer 341, a non-crystalline GaN or AlN layer grown at a low temperature may be used. The buffer layer 341 may further comprise an Al seed layer formed on the substrate and an AlN layer formed on the Al seed layer. The Al seed layer is deposited on the sapphire substrate to a thickness of several dozen Å by supplying a trimethylaluminum (TMAl) source for several minutes without using an ammonia ($NH_3$) source at a temperature of 1,100° C. or more with the MOCVD process. The Al seed layer is prepared so as to accelerate nucleus growth of the AlN layer formed on the Al seed.

The AlN layer is formed in a single crystal state on the Al seed layer. The AlN layer acts as a buffer layer for reducing the differences in the thermal expansion coefficients and in the stresses caused by the lattice mismatching between the sapphire substrate 30 and the GaN layers formed thereon. The AlN layer is also formed as a single AlN crystal by supplying the TMAl and $NH_3$ sources at a temperature of 1,100° C. or more using the MOCVD process. The AlN layer preferably has a thickness of 10 nm~50 nm.

Conventionally, a GaN layer or an AlN layer grown at a low temperature was mainly used as the buffer layer material. The conventional GaN buffer layer grown at a low temperature has a great number of crystalline defects and properties closer to a non-crystalline structure rather than a crystalline structure. Thus, the GaN buffer layer has a serious lattice mismatching with the sapphire substrate and with the GaN semiconductor layer grown on the GaN buffer layer. However, in the present invention, an AlN layer grown at a high temperature may be prepared as a single crystal, thereby providing advantages of reducing the lattice mismatching with the sapphire substrate and with the GaN semiconductor layer compared with the conventional AlN layer grown at a low temperature. Thus, more preferably, the buffer layer 341 may comprise the Al seed layer formed on the substrate and the AlN layer formed on the Al seed layer.

The GaN interlayer 342 is formed on the buffer layer 341, more accurately on the AlN layer. The GaN interlayer 342 also acts as a kind of buffer layer and is prepared to compensate for the difference in lattice parameters from that of the AlN layer. The GaN interlayer 342 may also be formed using the well-known MOCVD process. The GaN interlayer 342 is also deposited on the AlN layer by supplying a trimethylgallium (TMGa) source and the ammonia ($NH_3$) source for several minutes at a temperature of 1,050° C. or more using the MOCVD process. With regard to this, the GaN interlayer 342 is grown very slowly by lowering the amount of TMGa so that a ratio of V/III is 134,000, and is preferably formed to have a thickness of 100 nm~1 μm.

The Al-doped GaN layer 343 is formed on the GaN interlayer 342. Conventionally, before the n-type GaN clad layer is formed, an un-doped GaN layer is formed to prevent the defects caused by the lattice mismatching. However, in the conventional un-doped GaN layer, point defects, referred to as "Ga vacancies," are created, deteriorating the properties of LED. Specifically, due to the Ga vacancies created on the un-doped GaN layer, there arise problems that the advantageous effects of the un-doped GaN layer for alleviating the lattice mismatching are deteriorated, and that the defects caused by the dislocations cannot be reduced. The Ga vacancies are created by Ga deficiency and cause Ga and N not to be combined in the same amount when growing the GaN layer. Further, Ga vacancies cause the crystallinity of GaN to deteriorate, by which the crystallinity in the active layer formed on GaN is also deteriorated. Thus, defect level emitting heat, instead of light, in the lattice is generated, trapping the electrons, thereby reducing generation of photon. Thus, there arises a problem of deteriorated LED brightness.

According to the present invention, in order to solve the above problems, a small amount of Al is to be doped when growing the GaN layer. Like Ga, Al belongs to group III and fills the Ga vacancies to prevent the electrons from being trapped. As a result, a reduction of electrons due to trapping can be prevented to enhance the brightness of the LED.

The Al-doped GaN layer 343 is preferably formed to have Al in a content of 0.01%~1% by supplying the TMAl source for Al doping, simultaneously with supplying the TMGa and $NH_3$ sources for a ratio of V/III to be 2,400 at a temperature of 1,020° C.~1,030° C. with the MOCVD process. Since if the content of Al is 1% or more, an AlGaN compound is generated, Al should be doped in a content of less than 1%. Further, the Al-doped GaN layer 343 preferably has a thickness of 1 μm~4 μm.

The n-type GaN clad layer 31 may comprise the n-doped GaN semiconductor material on the Al-doped GaN layer 343 using Si and Al for the impurities. As when forming the Al-doped GaN layer 343, Al is doped together so as to prevent the Ga vacancies from trapping the electrons. With the Al doping, there are provided advantages of reducing not only the defects caused by the Ga vacancies, but also the defects caused by the dislocations. The GaN clad layer 31 may also be deposited for Al to be doped in a content of 0.01%~1% together with Si at a temperature of 1,020° C.~1,030° C. with the well-known MOCVD process.

The active layer 32 may comprise InGaN or GaN having a quantum well structure on the n-type GaN clad layer 31. The active layer 32 may be also deposited using a well-known deposition process, such as the MOCVD process. The active layer 32 may be formed to expose a predetermined portion of the n-type GaN clad layer 31. This is for forming an n-side electrode on the exposed portion of n-type GaN clad layer 31.

The p-type GaN clad layer 33 is formed on the active layer 32. The p-type GaN clad layer 33 may be formed as a GaN layer doped with Mg using a well-known deposition process, such as the MOCVD process.

On the p-type GaN clad layer 33, a p-metal layer (not shown) is formed to enhance the electric current injection effect and create the ohmic contact. As for a material of the p-metal layer, Ni/Au or ITO may be used, which is well-known in the art. On the p-metal layer, a p-side bonding pad (not shown) is formed to provide wire bonding, while on the exposed portion of the GaN clad layer 32, an n-side bonding pad (not shown) is formed.

FIGS. 4a to 4f are perspective views of a flow diagram showing a method of manufacturing a GaN semiconductor LED according to an embodiment of the present invention.

Figure 4:
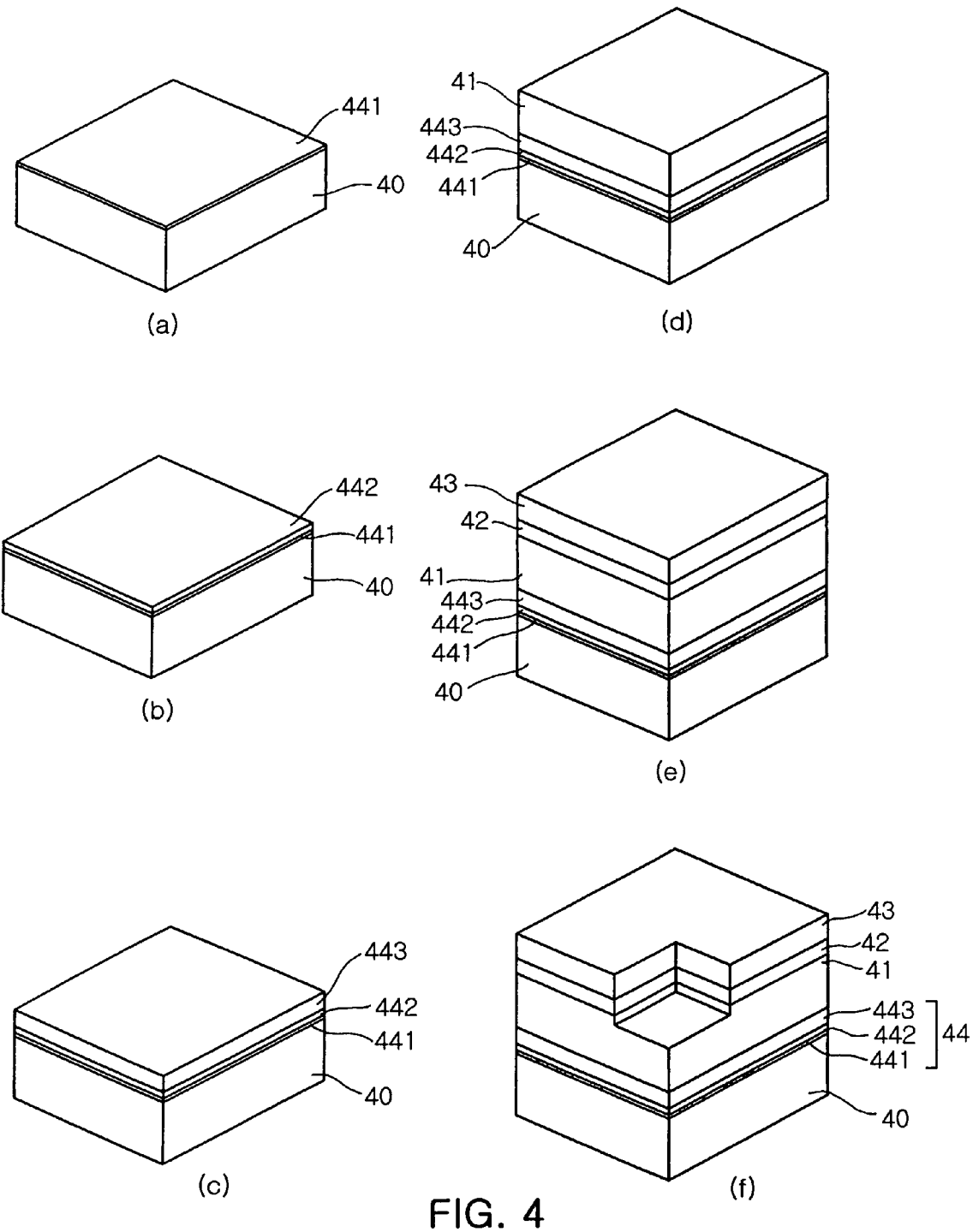
FIGS. 4a to 4f are perspective views of a flow diagram showing a method of manufacturing a GaN semiconductor LED according to an embodiment of the present invention.

At first, as shown in FIG. 4a, a buffer layer 441 is formed on a substrate 40. As for the buffer layer 441, the GaN layer or the AlN layer grown at a low temperature may be used. As described above, in the present invention, more preferably, the buffer layer may comprise the Al seed layer formed on the substrate and the AlN layer formed on the Al seed layer. Thus, the buffer layer 441 is formed on the substrate 40 with a formation of the Al seed layer having a thickness of several dozen Å by supplying the TMAl source without using the NH$_3$ source at a temperature of 1,100° C. or more, and then with a formation of the single crystal AlN layer on the Al seed layer by supplying the TMAl source together with the NH$_3$ source at a temperature of 1,100° C. or more using the MOCVD process, respectively.

Subsequently, as shown in FIG. 4b, a GaN interlayer 442 is formed on the buffer layer 441. More accurately, the GaN interlayer 442 is formed on the AlN layer. The GaN interlayer 442 is also deposited on the AlN layer by supplying the TMGa and NH$_3$ sources for several minutes at a temperature of 1,050° C. or more with the MOCVD process. With regard to this, the GaN interlayer 442 is grown very slowly for a ratio of V/III to be 134,000 by reducing the amount of TMGa and preferably formed to have a thickness of 100 nm~1 μm.

At the next step, as shown in FIG. 4c, an Al-doped GaN layer 443 is formed on the GaN interlayer 442. The Al-doped GaN layer 443 is doped with Al to fill the point defects what are referred to as "Ga vacancies" created in the GaN layer. By Al doping, Al fills the Ga vacancies trapping the electrons, thereby enhancing the crystallinity, so that the crystallinity of the active layer formed on the Al-doped GaN layer 443 is enhanced resulting in improving the brightness of the LED. The Al-doped GaN layer 443 may be formed to have Al in a content of 0.01%~1% by supplying the TMAl source for Al doping, simultaneously with supplying the TMGa and NH$_3$ sources for a ratio of V/III to be 2,400 at a temperature of 1,020° C.~1,030° C. with the MOCVD process. The Al-doped GaN layer 443 is preferably formed to have a thickness of 1 μm~4 μm.

Then, as shown in FIG. 4d, an n-type GaN clad layer 41 is formed on the Al-doped GaN clad layer 443. The n-type GaN clad layer 41 is formed by growing the n-type doped semiconductor material using Si and Al for the impurities. The GaN clad layer 41 may also be formed by depositing the GaN layer for Al to be doped in a content of 0.01%~1%, concurrently with depositing Si at a temperature of 1,020° C.~1,030° C. using the well-known MOCVD process. As when forming the Al-doped GaN layer 443, the Al doping is prepared to prevent the Ga vacancies from trapping the electrons. By the Al doping, not only the defects caused by the Ga vacancies but also the defects by the dislocations can be reduced concurrently.

Subsequently, as shown in FIG. 4e, an active layer 42 and a p-type GaN clad layer 43 are sequentially formed on the n-type GaN clad layer 41. The active layer 42 may consist of InGaN or GaN with a quantum well structure on the n-type GaN clad layer 41, and the p-type GaN clad layer 43 may be formed as a GaN layer doped with Mg. The active layer 42 and the p-type GaN clad layer 43 are also formed using a well-known deposition process, such as the MOCVD process.

As shown in FIG. 4f, a predetermined portion of the n-type GaN clad layer 41 are exposed by removing a predetermined portion of the active layer 42 and p-type clad layer 43. Finally, the p-metal layer (not shown) consisting of Ni/Au or ITO is formed on the p-type GaN clad layer 43 to enhance the electric current injection effect and create the ohmic contact. On the p-metal layer, the p-side bonding pad (not shown) is formed for wire bonding, and the n-side bonding pad (not shown) is formed on the exposed portion of the n-type GaN clad layer.

The p-type GaN clad layer 43 is formed on the active layer 42. The p-type GaN clad layer 43 and the n-type GaN clad layer 42 may be formed as the GaN layer doped with Mg using a well-known deposition process, such as the MOCVD process.

FIGS. 5 to 8 show the enhanced effects in the crystallinity of the GaN semiconductor LED according to the present invention.

Figure 5:
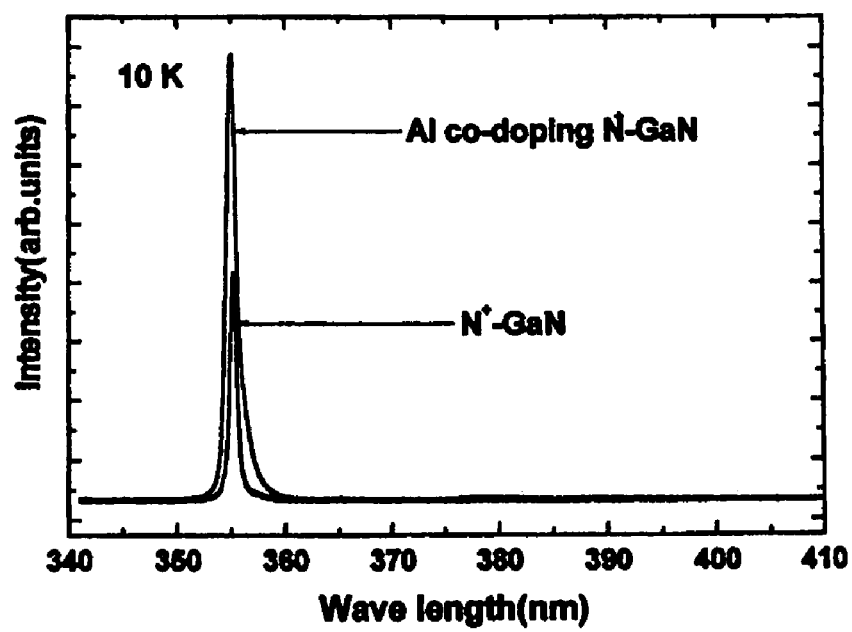
FIG. 5 is a graph showing the PL (Photo-Luminescence) characteristics of the conventional Si-doped n-type GaN clad layer and of an n-type GaN clad layer doped with Si and Al according to the present invention.
Figure 6:
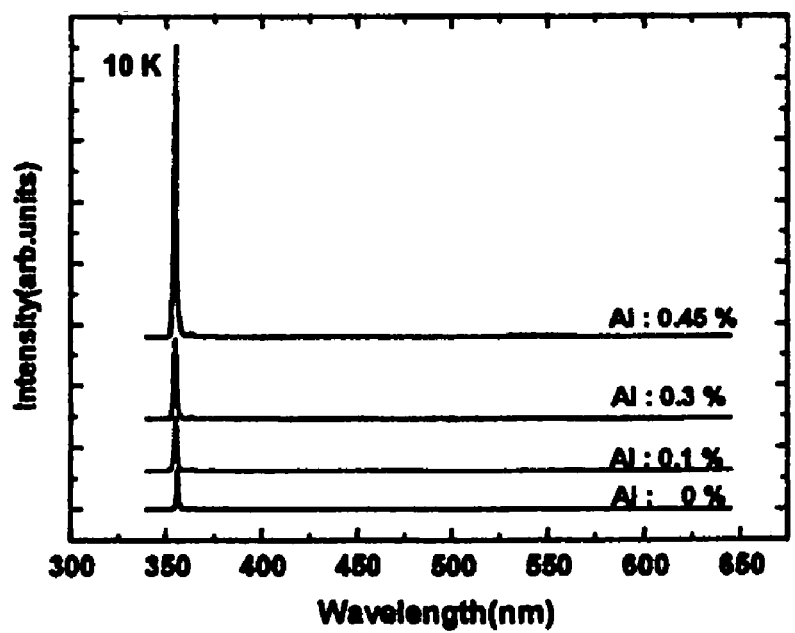
FIG. 6 is a graph showing the PL characteristics of an un-doped GaN clad layer and of an Al-doped GaN layer.

FIG. 5 is a graph showing the PL (Photo Luminescence) characteristics of the conventional Si-doped n-type GaN clad layer and of the n-type GaN clad layer doped with Si and Al according to the present invention, and FIG. 6 is a graph showing the PL characteristics of the un-doped GaN clad layer and of the Al-doped GaN layer according to the present invention. As shown in FIGS. 5 and 6, the n-type GaN clad layer doped with Si and Al, and the Al-doped GaN clad layer according to the present invention exhibit a remarkably higher intensity of light than the un-doped GaN clad layer. This results from the enhanced PL characteristics by reducing a recombining level such as vacancies, by the Al doping when growing the n-type GaN clad layer or the GaN layer. Specifically, as shown in FIG. 6, the PL characteristics are further enhanced as the doping amount of Al is increased. However, the wavelengths having peal values are gradually decreased. In this regard, it is considered that in case of Al in a content of less than 1%, a variation in wavelength can be disregarded.

Figure 7:
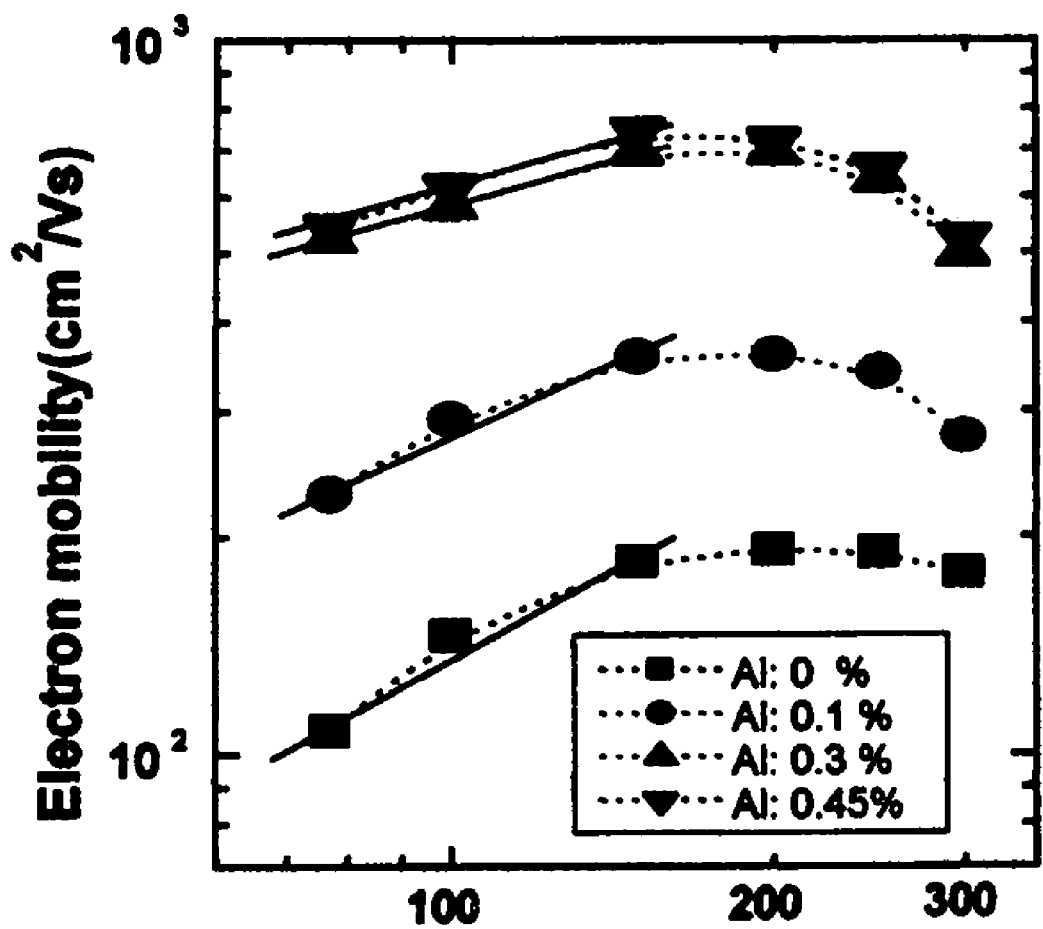
FIG. 7 is a graph showing the electron mobility of the un-doped GaN layer and the Al-doped GaN layer.
Figure 8:
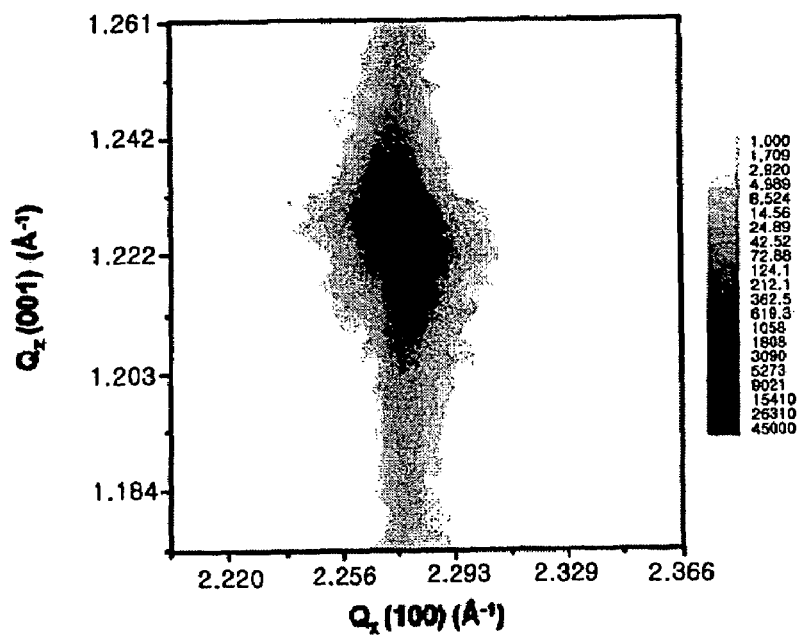
FIGS. 8a and 8b are reciprocal space maps illustrated using HR-XRD (High Resolution X-Ray Diffraction).
Figure 8:
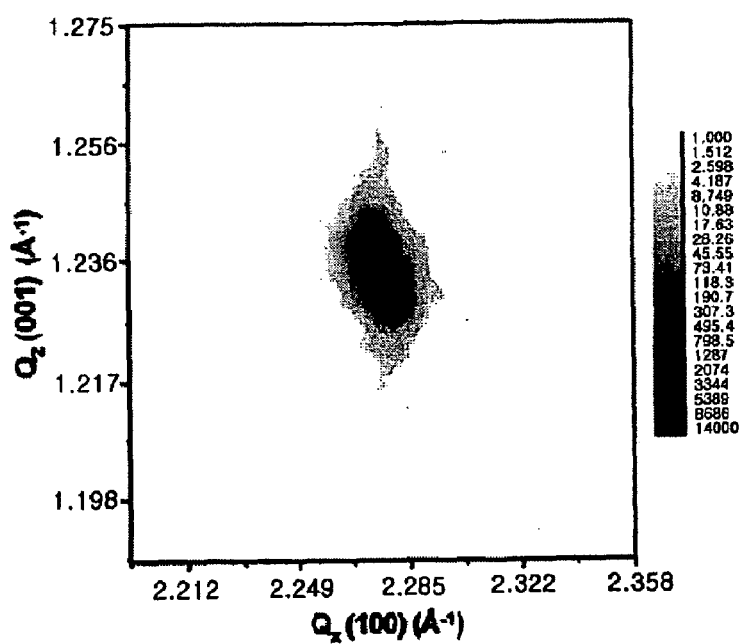

FIG. 7 is a graph illustrating the electron mobility in the un-doped GaN layer and the Al-doped GaN layer. In general, the electron mobility at a high temperature [at 700 K (room temperature) in FIG. 7] is influenced by the impurity while the electron mobility at a low temperature (at 77 K in FIG. 7) by the lattice. Referring to FIG. 7, it can be known that the case of being doped with Al exhibits a remarkable enhancement in the electron mobility as a whole. The Ga vacancies trapping the electrons in the growth of GaN are filled with the doped Al, thereby increasing the number of electrons which can move. If Al is not doped, the electron mobility at the low temperature (77 K) is rapidly decreased compared with the electron mobility at high temperature. Meanwhile, if Al is doped in a content of 0.45%~0.3%, the electron mobility at the low temperature (77 K) is increased compared with the electron mobility at high temperature. That is, the excellence in the electron mobility, which is mainly affected by the lattice at the low temperature (77 K), is caused by the considerable reduction of lattice defects, such as dislocations, with the Al doping.

FIGS. 8a and 8b show reciprocal space maps depicted using HR-XRD (High Resolution X-Ray Diffraction). FIG. 8a shows the reciprocal space map of the un-doped GaN layer, while FIG. 8b shows the reciprocal space map of the Al-doped GaN layer. As shown in FIG. 8a, the reciprocal space map of the un-doped GaN layer exhibits an un-symmetrical shape due to compressive strains caused by the defects. On the contrary, as shown in FIG. 8a, that of the Al-doped GaN layer of the present invention exhibits a symmetrical shape compared with FIG. 8a. This is caused by the considerable reduction of dislocations by the Al doping. That is, according to the present invention, the dislocations caused by the lattice mismatching can be significantly reduced with the Al doping, thereby remarkably enhancing the crystallinity.

As apparent from the above description, according to the present invention, there are provided advantageous effects in that when forming the n-type GaN clad layer and the GaN layer formed to enhance the crystallinity of the n-type GaN layer, a small amount of doped Al may prevent the point defects, such as Ga vacancies, from trapping the electrons, thereby enhancing the electron mobility leading to enhancement of the electrical and optical properties of the LED. Further, the defects, such as dislocations, can be reduced, thereby enhancing the crystallinity of the GaN layer and n-type GaN clad layer. Additionally, a superior quality of crystal growth can be ensured with a lower cost, without using an expensive process, such as the LEO method or the pendioepitaxy method.

Although the preferred embodiment of the present invention have been disclosed for illustrative purpose, those skilled in the art will appreciate that various modifications, additions and substitutions are possible without departing from the scope and spirit of the invention as disclosed in the accompanying claims.

What is claimed is:

1. A method of manufacturing a GaN semiconductor light emitting device comprising the steps of:
   a) preparing a substrate for growing a GaN semiconductor material;
   b) forming an n-type GaN clad layer doped with Al on the substrate;
   c) forming an active layer having a quantum well structure on the n-type GaN clad layer; and
   d) forming a p-type GaN clad layer on the active layer, the method further comprising the step of:
   e) forming a buffer layer on the substrate before the step b);
   f) removing a predetermined portion of the active layer and p-type clad layer to expose a predetermined portion of the n-type clad layer;
   g) forming a p-metal layer on the p-type clad layer; and
   h) forming a p-side bonding electrode and an n-side electrode on the p-metal layer and on the exposed portion of the n-type clad GaN layer, respectively;
   wherein in step b) the n-type GaN clad layer is doped with Al in a content of 0.01% to 1%.

2. The method as set forth in claim 1, wherein the step e) comprises the steps of:
   e-1) forming an Al seed layer on the substrate layer; and
   e-2) forming a single crystal AlN layer on the Al seed layer.

3. The method as set forth in claim 2, wherein the step e-2) comprises the step of forming a single crystal AlN layer at a high temperature of 1,000° C.-1,100° C. using an MOCVD (Metal Organic Vapor Deposition) process.

4. The method as set forth in claim 2, wherein the step e-2) comprises the step of forming a single crystal AlN layer with a thickness of 10 nm-50 nm.

5. The method as set forth in claim 1, wherein the step e) comprises the step of forming a non-crystalline AlN layer on the substrate or the step of forming a non-crystalline GaN layer on the substrate.

6. The method as set forth in claim 1, the method further comprising the step of:
   f) forming a GaN interlayer on the buffer layer before the step b).

7. The method as set forth in claim 6, wherein the step f) comprises the step of forming a GaN interlayer with a thickness of 100 nm-1 µm.

8. The method as set forth in claim 6, the method further comprising the step of:
   g) forming an Al-doped GaN layer on the GaN interlayer before the step b).

9. The method as set forth in claim 8, wherein the step g) comprises the step of forming a GaN layer doped with Al in a content of 0.01%-1%.

10. The method as set forth in claim 8, wherein the step g) comprises the step of forming a GaN layer with a thickness of 1 µm-4 µm.

* * * * *